US012580570B2

(12) United States Patent
Hsu et al.

(10) Patent No.: US 12,580,570 B2
(45) Date of Patent: Mar. 17, 2026

(54) LEVEL SHIFTER HAVING A CROSS-COUPLED CURRENT MIRROR CIRCUIT FOR REDUCING OR CANCELLING COMMON MODE SLEW CURRENT

(71) Applicant: Infineon Technologies Austria AG, Villach (AT)

(72) Inventors: Ching Tiu Hsu, Villach (AT); Tin Chee Chan, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/523,125

(22) Filed: Nov. 29, 2023

(65) Prior Publication Data

US 2025/0175179 A1 May 29, 2025

(51) Int. Cl.
*H03K 19/0185* (2006.01)
*H03K 3/012* (2006.01)
*H03K 3/356* (2006.01)

(52) U.S. Cl.
CPC ..... *H03K 19/018521* (2013.01); *H03K 3/012* (2013.01); *H03K 3/356113* (2013.01)

(58) Field of Classification Search
CPC ........... H03K 19/018521; H03K 3/012; H03K 3/356113
See application file for complete search history.

(56) References Cited

U.S. PATENT DOCUMENTS

| | | | |
|---|---|---|---|
| 4,692,641 A | 9/1987 | Highton | |
| 4,945,265 A | 7/1990 | Estrada | |
| 6,211,706 B1 | 4/2001 | Choi et al. | |
| 7,893,730 B2 | 2/2011 | Jung et al. | |
| 8,598,936 B2 | 12/2013 | Kuge | |
| 9,722,610 B2 | 8/2017 | Akahane | |
| 9,979,397 B1 | 5/2018 | Zhu et al. | |
| 10,193,554 B1 | 1/2019 | Sharma et al. | |
| 10,483,977 B1 * | 11/2019 | Berwick | ........ H03K 19/018521 |

(Continued)

OTHER PUBLICATIONS

Costa Beber Vieira, Filipe, et al., "Level Shifter for Power Converters", U.S. Appl. No. 18/475,341, filed Sep. 27, 2023, pp. 1-49.

*Primary Examiner* — Sibin Chen
(74) *Attorney, Agent, or Firm* — Murphy, Bilak & Homiller, PLLC

(57) ABSTRACT

A level shifter includes: a low voltage domain configured to output non-overlapping first and second current pulses based on opposite edges of a logic input signal; and a high voltage domain comprising a latch and a current mirror circuit configured to mirror the non-overlapping first and second current pulses such that the latch is set when the first current pulse is active and reset when the second current pulse is active. The current mirror circuit includes a first mirroring path for the first current pulse and a second mirroring path for the second current pulse. The level shifter has a common mode slew current that is added to the non-overlapping first and second current pulses. The first mirroring path and the second mirroring path are cross-coupled such that the common mode slew current is reduced or cancelled before the non-overlapping first and second current pulses are input to the latch.

14 Claims, 1 Drawing Sheet

(56) References Cited

U.S. PATENT DOCUMENTS

| | | | |
|---|---|---|---|
| 10,536,140 B1 | 1/2020 | Ribarich et al. | |
| 10,749,509 B1 | 8/2020 | Cascio et al. | |
| 10,868,536 B1 * | 12/2020 | Ke | H03K 19/018514 |
| 11,183,835 B2 | 11/2021 | Lee et al. | |
| 11,606,031 B1 | 3/2023 | Oporta et al. | |
| 11,942,942 B1 * | 3/2024 | Chan | H03K 3/356182 |
| 12,362,752 B2 | 7/2025 | Lam | |
| 2002/0105311 A1 | 8/2002 | Rutter et al. | |
| 2005/0122754 A1 | 6/2005 | Nielsen | |
| 2012/0229165 A1 | 9/2012 | Tseng et al. | |
| 2014/0152369 A1 * | 6/2014 | Qi | H03K 19/018528 |
| | | | 327/333 |
| 2016/0277008 A1 | 9/2016 | Green et al. | |
| 2017/0110971 A1 | 4/2017 | Degen et al. | |
| 2018/0034466 A1 | 2/2018 | Zhang et al. | |
| 2018/0302072 A1 | 10/2018 | Abesingha et al. | |
| 2019/0140635 A1 | 5/2019 | Abesingha et al. | |
| 2020/0018782 A1 | 1/2020 | Gupta et al. | |
| 2020/0044648 A1 | 2/2020 | Sharma et al. | |
| 2020/0162074 A1 | 5/2020 | Niikura | |
| 2020/0382122 A1 | 12/2020 | Niikura | |
| 2021/0218389 A1 | 7/2021 | Rajalakshmi et al. | |
| 2021/0351686 A1 | 11/2021 | Bognanni et al. | |
| 2022/0103162 A1 * | 3/2022 | Shuvalov | H02M 3/158 |
| 2022/0302839 A1 | 9/2022 | Ishino | |
| 2024/0106318 A1 | 3/2024 | Kwak et al. | |
| 2025/0175179 A1 | 5/2025 | Hsu et al. | |
| 2025/0211231 A1 | 6/2025 | Lin | |

* cited by examiner

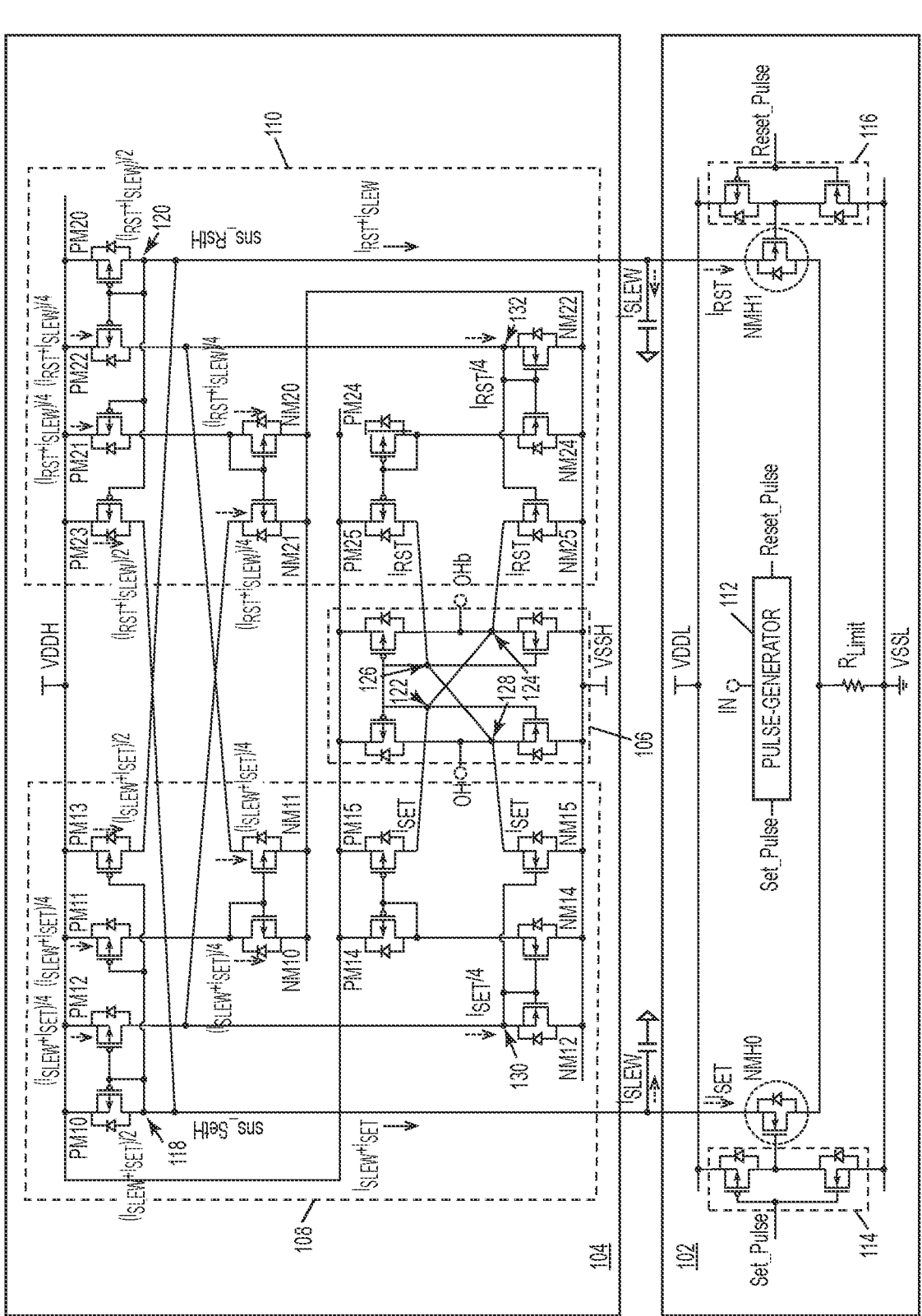

LEVEL SHIFTER HAVING A CROSS-COUPLED CURRENT MIRROR CIRCUIT FOR REDUCING OR CANCELLING COMMON MODE SLEW CURRENT

BACKGROUND

In multi-voltage domain applications, level translation is required for propagating signals from one voltage level to another. With higher switching requirements (e.g., >50V/ns), and especially for wide bandgap applications, conventional level shifter designs have limited capability with respect to fast dv/dt switching. In low-voltage applications (e.g., 3V or lower), a conventional level shifter provides good speed and current consumption performance. However, in high voltage applications (e.g., 3V up to 120V or more), conventional level shifter designs are speed-limited because high-voltage devices have larger parasitic capacitance and channel resistance. To improve propagation delay time, current signal driving was introduced. With high-speed dV/dt requirement, e.g. GaN requires dV/dt>50V/ns, a noise injection error is common for conventional level shifter designs. To ensure a stable signal propagation when the voltage is rising or falling, a large DC biasing current is usually applied which increases current consumption. Also, device parasitics increase due to geometric (layout) limits of the device versus the application voltage. For example, a high-speed transition of >50V/ns requires tens of milliamps (mA) of current to charge the parasitic capacitances for a 150V NMOS device. Tens of mA of current for a level shifter design is problematic for power-sensitive applications such as battery applications.

Thus, there is a need for an improved level shifter design.

SUMMARY

According to an embodiment of a level shifter, the level shifter comprises: a low voltage domain configured to output non-overlapping first and second current pulses based on opposite edges of a logic input signal; and a high voltage domain comprising a latch and a current mirror circuit configured to mirror the non-overlapping first and second current pulses such that the latch is set when the first current pulse is active and reset when the second current pulse is active, wherein the current mirror circuit comprises a first mirroring path for the first current pulse and a second mirroring path for the second current pulse, wherein the level shifter has a common mode slew current that is added to the non-overlapping first and second current pulses, wherein the first mirroring path and the second mirroring path are cross-coupled such that the common mode slew current is reduced or cancelled before the non-overlapping first and second current pulses are input to the latch.

According to an embodiment of a method of operating a level shifter that has a low voltage domain and a high voltage domain, the method comprises: applying a logic input signal to the low voltage domain such that the low voltage domain outputs non-overlapping first and second current pulses based on opposite edges of the logic input signal; mirroring the first current pulse via a first mirroring path in the high voltage domain and the second current pulse via a second mirroring path in the high voltage domain such that a latch in the high voltage domain is set when the first current pulse is active and reset when the second current pulse is active, wherein the first mirroring path and the second mirroring path are cross-coupled; and reducing or cancelling a common mode slew current added to the non-overlapping first and second current pulses before the non-overlapping first and second current pulses are input to the latch.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a circuit schematic of an embodiment of a level shifter having a cross-coupled current mirror circuit for reducing or cancelling common mode slew current.

DETAILED DESCRIPTION

The embodiments described herein provide a level shifter for fast switching applications, e.g., dV/dt>50V/ns. The level shifter uses a current pulse to enable signal translation from one voltage level to another. The current pulse level may be controlled by a current limiting resistor, which reduces static current consumption of the level shifter. To overcome the input signal being overwritten by parasitic charging that results from the voltage level rising or falling, common-mode signal cancellation may be introduced. In this case, the generated parasitic charging current at the set/reset path of the level shifter latch during voltage changes is cancelled by a complementary signal. The remaining signal current from the set/reset path of the latch propagates correctly. The latch is implemented in a high-voltage domain (e.g., 3V up to 120V or more) and used to capture an input steady state from a low-voltage domain of the level shifter.

Described next, with reference to the FIGURES, are exemplary embodiments of the level shifter.

FIG. 1 illustrates an embodiment of a level shifter 100. The level shifter 100 includes a low voltage (e.g., 5V or lower, 3V or lower, etc.) domain 102 configured to output non-overlapping first (e.g., set) and second (e.g., reset) current pulses '$I_{SET}$', '$I_{RST}$' based on opposite edges of a logic input signal 'IN'. For example, the rising edge of the logic input signal IN may be used to generate the set (first) pulse $I_{SET}$ and the falling edge of the logic input signal IN may be used to generate the reset (second) pulse $I_{RST}$. The width of the non-overlapping first and second current pulses $I_{SET}$, $I_{RST}$ is technology dependent, e.g., based on reverse recovery time for high voltage pMOS devices. For example, the non-overlapping first and second current pulses $I_{SET}$, $I_{RST}$ may both have a pulse width greater than 15 ns.

The level shifter 100 may be implemented in any high voltage capable semiconductor technology having a designated high voltage (e.g., 3V up to 120V or higher) domain 104 isolated from the low voltage domain 102, e.g., such as high voltage Si (silicon) technology. The level shifter 100 may be used with drivers such as 3-phase motor drivers where the high voltage domain 104 may be part of any pre-driver or final driver stage, for example.

The high voltage domain 104 of the level shifter 100 includes a latch 106 and a current mirror circuit. The current mirror circuit is configured to mirror the non-overlapping first and second current pulses $I_{SET}$, $I_{RST}$ such that the latch

106 is set when the first current pulse $I_{SET}$ is active and reset when the second current pulse $I_{RST}$ is active. The current mirror circuit includes a first mirroring path 108 for the first current pulse $I_{SET}$ and a second mirroring path 110 for the second current pulse $I_{RST}$.

The level shifter 100 also has a common mode slew current '$I_{SLEW}$' that is added to the non-overlapping first and second current pulses $I_{SET}$, $I_{RST}$. The common mode slew current $I_{SLEW}$ occurs when either the first current pulse $I_{SET}$ or the second current pulse $I_{RST}$ has a transition (low-to-high or high-to-low), because of parasitic capacitances within the level shifter 100 such as metal routing capacitance, device (p- or n-) well capacitance, isolation capacitance, etc.

If the common mode slew current $I_{SLEW}$ is not mitigated, the magnitude of the non-overlapping first and second current pulses $I_{SET}$, $I_{RST}$ would have to be increased so that the current pulses $I_{SET}$, $I_{RST}$ are strong enough to trigger (set or reset) the latch 106. More particularly, a large capacitance may be present on both the set and reset current paths due to high voltage skew, e.g., 3V up to 120 V or more, e.g., in the case of the level shifter 100 being configured to provide bootstrap control for a buck regulator. The parasitic capacitance charges and discharges every set/resent current pulse transition, to set the high voltage circuitry. At relatively high speed (e.g., 20 MHz to 1000 MHZ), the common mode slew current $I_{SLEW}$ is large and dominates if the first and second current pulses $I_{SET}$, $I_{RST}$ are small, causing a fault.

To mitigate this problem, the first mirroring path 108 and the second mirroring path 110 of the current mirror circuit included in the high voltage domain 104 of the level shifter 100 are cross-coupled such that the common mode slew current $I_{SLEW}$ is reduced or cancelled before the non-overlapping first and second current pulses $I_{SET}$, $I_{RST}$ are input to the latch 106. As a result, only the first (set) and second (reset) current pulses $I_{SET}$, $I_{RST}$ remain which reduces current consumption for both mirroring paths 108, 110 of the high voltage domain 104. Otherwise, much higher current for the current pulses $I_{SET}$, $I_{RST}$ would be needed so that signals are not overridden/dominated by the common mode slew current $I_{SLEW}$. The mirroring paths 108, 110 of the high voltage domain 104 ideally match for effective common mode cancellation but some mismatch may be present, meaning not all common mode current may be cancelled.

In one embodiment, the non-overlapping first and second current pulses $I_{SET}$, $I_{RST}$ are controlled by the same resistor '$R_{LIMIT}$' in the low voltage domain 102. According to this embodiment, the low voltage domain 102 of the level shifter 100 includes a pulse generator 112 configured to generate a first pulse 'Set_Pulse' based on a rising or falling edge of the logic input signal IN and a second pulse 'Reset_Pulse' based on the other one of the rising or falling edge of the logic input signal IN. A set or reset current for triggering the latch 106 in the high voltage domain 104 flows only when the corresponding pulse $I_{SET}$, $I_{RST}$ is active in the low voltage domain 102, reducing static current consumption. The transient current is determined by the width of the corresponding current pulse $I_{SET}$, $I_{RST}$.

A first inverter 114 coupled between a voltage rail 'VDDL' and a reference rail 'VSSL' of the low voltage domain 102 has an input controlled by the first pulse Set_Pulse. A second inverter 116 coupled between the voltage rail VDDL and the reference rail VSSL of the low voltage domain 102 has an input controlled by the second pulse Reset_Pulse. A first nMOS transistor device NMH0 has a gate coupled to the output of the first inverter 114, a drain that delivers the first current pulse $I_{SET}$ to the first mirroring path 108 of the current mirror circuit in the high voltage domain 104, and a source. A second nMOS transistor device NMH1 has a gate coupled to the output of the second inverter 116, a drain that delivers the second current pulse $I_{RST}$ to the second mirroring path 110 of the current mirror circuit in the high voltage domain 104, and a source.

The same resistor $R_{LIMIT}$ couples the source of the first nMOS transistor device NMH0 and the source of the second nMOS transistor device NMH1 to the reference rail VSSL of the low voltage domain 102. Accordingly, the non-overlapping first and second current pulses $I_{SET}$, $I_{RST}$ should have the same magnitude which reduces current mismatch compared to using two separate current sources which would instead result in two paths from supply (VDDL) to ground (VSSL) and increases current mismatch.

In one embodiment, the first mirroring path 108 and the second mirroring path 110 of the current mirror circuit are symmetric. Separately or in combination, both the first mirroring path 108 and the second mirroring path 110 of the current mirror circuit may include nMOS ('NM') and pMOS ('PM') transistor devices 'NM10'-'NM15', 'NM20'-'NM25', 'PM10'-'PM15', 'PM20'-'PM25', where the nMOS and pMOS transistor devices NM10-NM15, PM10-PM15 of the first mirroring path 108 and the nMOS and pMOS transistor devices NM20-NM25, PM20-PM25 of the second mirroring path 110 have matching transconductance.

For example, the first mirroring path 108 of the current mirror circuit may include a plurality of first pMOS transistor devices PM10-PM13 each having a source coupled to a first voltage rail 'VDDH' of the high voltage domain 104, a gate driven by the first current pulse $I_{SET}$ and the common mode slew current $I_{SLEW}$, and a drain. The second mirroring path 110 of the current mirror circuit likewise may include a plurality of second pMOS transistor devices PM20-25 each having a source coupled to the first voltage rail VDDH of the high voltage domain 104, a gate driven by the second current pulse $I_{RST}$ and the common mode slew current $I_{SLEW}$, and a drain.

The drain of a first one 'PM10' of the first pMOS transistor devices PM10-PM13 may be coupled to a node 118 of the first mirroring path 108 into which the first current pulse $I_{SET}$ and the common mode slew current $I_{SLEW}$ flows. The drain of a first one 'PM20' of the second pMOS transistor devices PM20-PM25 is coupled to a node 120 of the second mirroring path 110 into which the second current pulse $I_{RST}$ and the common mode slew current $I_{SLEW}$ flows. The first pMOS transistor device PM10, PM20 of both mirroring paths 108, 110 are the main devices of the respective mirroring paths 108, 110, where the current $(I_{SET}+I_{SLEW})/2$, $(I_{RST}+I_{SLEW})/2$ of each first pMOS transistor device PM10, PM20 is set by the corresponding current pulse $I_{SET}$, $I_{RST}$ in the low voltage domain 102 and controlled by the shared resistor $R_{LIMIT}$. For example, the first one PM10 of the first pMOS transistor devices PM10-PM13 may be sized to support the first current pulse $I_{SET}$ plus the common mode slew current $I_{SLEW}$ and the first one PM20 of the second pMOS transistor devices PM20-PM25 may be sized to support the second current pulse $I_{RST}$ plus the common mode slew current $I_{SLEW}$.

The drain of a second one 'PM13' of the first pMOS transistor devices PM10-PM13 may be cross-coupled to the node 120 of the second mirroring path 110 into which the second current pulse $I_{RST}$ and the common mode slew current $I_{SLEW}$ flows. The drain of a second one 'PM23' of the second pMOS transistor devices PM20-25 likewise may be cross-coupled to the node 118 of the first mirroring path 108 into which the first current pulse $I_{SET}$ and the common mode slew current $I_{SLEW}$ flows. Each leg PM10-PM13, PM20-

PM23 of the current mirror circuit provides a fraction '1/N' of the current $(I_{SET}+I_{SLEW})$, $(I_{RST}+I_{SLEW})$ flowing through the main device. The mirrored cross-coupled pMOS device pair PM13 and PM23 reduce the common-mode current by half in FIG. 1.

Any time the latch 106 is set or reset, the common mode slew current $I_{SLEW}$ either charges or discharges both sides. However, the first mirroring path 108 and the second mirroring path 110 of the current mirror circuit included in the high voltage domain 104 of the level shifter 100 are cross-coupled, e.g., via the second pMOS transistor device PM13 of the first pMOS transistor devices PM10-PM13 and the second pMOS transistor device PM23 of the second pMOS transistor devices PM20-PM23. Accordingly, the common mode slew current $I_{SLEW}$ is reduced or cancelled before the non-overlapping first and second current pulses $I_{SET}$, $I_{RST}$ are input to the latch 106.

The first mirroring path 108 of the current mirror circuit may include a plurality of first nMOS transistor devices 'NM10'-'NM11' configured to reduce or cancel the common mode slew current $I_{SLEW}$ from the first current pulse $I_{SET}$. The second mirroring path 110 of the current mirror circuit may include a plurality of second nMOS transistor devices 'NM20'-'NM21' configured to reduce or cancel the common mode slew current $I_{SLEW}$ from the second current pulse $I_{RST}$.

For example, each first nMOS transistor device NM10, NM11 may have a source coupled to a second voltage rail 'VSSH' of the high voltage domain 104, a gate driven by the drain of a third one 'PM11' of the first pMOS transistor devices PM10-PM13, and a drain. Each second nMOS transistor device NM20, NM21 similarly may have a source coupled to the second voltage rail VSSH of the high voltage domain 104, a gate driven by the drain of a third one 'PM21' of the second pMOS transistor devices PM20-PM23, and a drain.

The drain of a first one 'NM10' of the first nMOS transistor devices NM10-NM11 may be coupled to the drain of the third one PM11 of the first pMOS transistor devices PM10-PM13. The drain of a second one 'NM11' of the first nMOS transistor devices NM10-NM11 may be cross-coupled to the drain of a fourth one 'PM22' of the second pMOS transistor devices PM20-PM23. The drain of a first one 'NM20' of the second nMOS transistor devices NM20-NM21 may be coupled to the drain of the third one PM21 of the second pMOS transistor devices PM20-PM23. The drain of a second one 'NM21' of the second nMOS transistor devices NM20-NM21 may be cross-coupled to the drain of a fourth one 'PM12' of the first pMOS transistor devices PM10-PM13. The mirrored cross-coupled nMOS device pairs NM11 and NM21 cancel the common-mode current for pMOS device PM12 or pMOS device PM22 in FIG. 1. There is no common-mode current at nMOS devices NM12 and NM22 in FIG. 1.

As explained above, the low voltage domain 102 may include a first nMOS transistor device NMH0 that delivers the first current pulse $I_{SET}$ to the first mirroring path 108 of the current mirror circuit and a second nMOS transistor device NMH1 that delivers the second current pulse $I_{RST}$ to the second mirroring path 110 of the current mirror circuit. Both the first nMOS transistor device NMH0 and the second nMOS transistor device NMH1 of the low voltage domain 102 may have a size of N. Each of the first one PM10 of the first pMOS transistor devices PM10-PM13, the second one PM13 of the first pMOS transistor devices PM10-PM13, the first one PM20 of the second pMOS transistor devices PM20-PM23, and the second one PM23 of the second pMOS transistor devices PM20-PM23 may have a size of N. Each of the third one PM11 of the first pMOS transistor devices PM10-PM13, the fourth one PM12 of the first pMOS transistor devices PM10-PM13, the third one PM21 of the second pMOS transistor devices PM20-PM23, and the fourth one PM22 of the second pMOS transistor devices PM20-PM23 may have a size of N/4.

The first mirroring path 108 of the current mirror circuit may further include a plurality of third pMOS transistor devices 'PM14'-'PM15' each having a source coupled to the first voltage rail VDDH of the high voltage domain 104, a gate, and a drain. The second mirroring path 110 of the current mirror circuit similarly may include a plurality of fourth pMOS transistor devices 'PM24'-'PM25' each having a source coupled to the first voltage rail VDDH of the high voltage domain 104, a gate, and a drain. The drain and the gate of a first one 'PM14' of the third pMOS transistor devices PM14-PM15 may be coupled together. The drain of a second one 'PM15' of the third pMOS transistor devices PM14-PM15 may be coupled to a first input node 122 and a first output node 124 of the latch 106. The drain and the gate of a first one 'PM24' of the fourth pMOS transistor devices PM24-PM25 may be coupled together. The drain of a second one 'PM25' of the fourth pMOS transistor devices PM24-PM25 may be coupled to a second input node 126 and a second output node 128 of the latch 106. In the case of the level shifter 100 being used with a driver such as 3-phase motor driver, the logic input signal IN input to the low voltage domain 102 may originate from a controller for the driver and the output 'OH', 'OHb' (inverted) of the latch 106 may be the gate drive signals. For example, the high voltage domain could be a pre-driver or final driver stage.

The first mirroring path 108 of the current mirror circuit may also include a plurality of third nMOS transistor devices 'NM12'-'NM15' each having a source coupled to the second voltage rail VSSH of the high voltage domain 104, a gate driven by the fourth one PM12 of the first pMOS transistor devices PM10-PM13, and a drain. The second mirroring path 110 of the current mirror circuit similarly may include a plurality of fourth nMOS transistor devices 'NM22'-'NM25' each having a source coupled to the second voltage rail VSSH of the high voltage domain 104, a gate driven by the drain of the fourth one PM22 of the second pMOS transistor devices PM20-PM23, and a drain. The drain of a first one 'NM12' of the third nMOS transistor devices NM12-NM15 may be coupled to the drain of the fourth one PM12 of the first pMOS transistor devices PM10-PM13. The drain of a second one 'NM14' of the third nMOS transistor devices NM12-NM15 may be coupled to the drain of the first one PM14 of the third pMOS transistor devices PM14-PM15. The drain of a third one 'NM15' of the third nMOS transistor devices NM12-NM15 may be coupled to the second output node 128 and the second input node 126 of the latch 106. The drain of a first one 'NM22' of the fourth nMOS transistor devices NM22-NM25 may be coupled to the drain of the fourth one PM22 of the second pMOS transistor devices PM20-PM23. The drain of a second one 'NM24' of the fourth nMOS transistor devices NM22-NM25 may be coupled to the drain of the first one PM24 of the fourth pMOS transistor devices PM24-PM25. The drain of a third one 'NM25' of the fourth nMOS transistor devices NM22-NM25 may be coupled to the first output node 124 and the first input node 122 of the latch 106.

The transistor sizing determines whether the common mode slew current $I_{SLEW}$ is entirely or partly cancelled. The transistor ratios may not be the same (½ and ¼) as shown in FIG. 1. For the ratios ½ and ¼ shown in FIG. 1, the common mode slew current $I_{SLEW}$ is entirely cancelled (if no mismatch). However, different ratios are still effective. If mismatch is present, the common mode slew current $I_{SLEW}$ is not completely cancelled but the transistor sizing ratios of $\frac{1}{2}$ and $\frac{1}{4}$ shown in FIG. 1 are most close to the ideal case (no mismatch). A transistor sizing ratio of $\frac{1}{3}$ would reduce the common mode slew current $I_{SLEW}$ but some portion of the common mode slew current $I_{SLEW}$ will be injected into the non-overlapping first (set) and second (reset) current pulses $I_{SET}$, $I_{RST}$, which means that the current pulses $I_{SET}$, $I_{RST}$ will have to be generated correspondingly higher to override $I_{SLEW}$, e.g., such as 2 to 4 and 4 to 8.

At node 130 in FIG. 1 and during a rising or falling transition in the first current pulse $I_{SET}$, the current I(NM12) in nMOS device NM12 is given by:

$$= I(PM12) - I(NM21) \tag{1}$$

$$= \left(1/2 * I_{SET} + 1/4 * I_{SLEW}\right) - \left(1/2 * I_{RST} + 1/4 * I_{SLEW}\right)$$

$$= 1/2 * I_{SET} - 1/2 * I_{RST}$$

where I(PM12) is the current in pMOS device PM12 and I(NM21) is the current in nMOS device NM12.

At node 132 in FIG. 1 and during a rising or falling transition in the second current pulse $I_{RST}$, the current I(NM22) in nMOS device NM22 is given by:

$$= I(PM22) - I(NM11) \tag{2}$$

$$= \left(1/2 * I_{RST} + 1/4 * I_{SLEW}\right) - \left(1/2 * I_{SET} + 1/4 * I_{SLEW}\right)$$

$$= 1/2 * I_{RST} - 1/2 * I_{SET}$$

where I(PM22) is the current in pMOS device PM22 and I(NM11) is the current in nMOS device NM11.

For the ideal case with no mismatch, none of the common mode slew current $I_{SLEW}$ appears at the set or resent inputs 122, 126 of the latch 106.

In differential mode, current balancing is achieved by symmetric set and reset paths. The non-overlapping first and second current pulses $I_{SET}$, $I_{RST}$ are defined by the threshold voltage of the first and second nMOS transistor devices NMH0, NMH1 and the shared resistor $R_{LIMIT}$ integrated in the low voltage domain 102. pMOS devices PM10 and PM20 in the high voltage domain 104 are sized to support $(I_{RST}+I_{SLEW})$ or $(I_{RST}+I_{SLEW})$. The non-overlapping first and second current pulses $I_{SET}$, $I_{RST}$ are larger than set/reset paths mismatch. The cross-coupled device pairs PM13-PM23, NM11-NM21, PM15-PM25 and NM15-NM25 secure the set and reset events.

When the first (set) current pulse $I_{SET}$ is active and the second (reset) current pulse $I_{RST}$ is inactive (zero), pMOS device PM13 pulls node 120 high, pMOS device PM20 is OFF, nMOS device NM11 pulls node 132 low, and nMOS device NM22 is OFF. The current at the set input 122 of the latch 106 is given by:

$$I(PM15) + I(NM25) \tag{3}$$

$$= I_{SET} - I_{RST}$$

$$\approx I_{SET}$$

where I(PM15) is the current in pMOS device PM15 and I(NM25) is the current in nMOS device NM25. The current at the reset input 126 of the latch 106 is given by:

$$I(PM25) + I(NM15) \tag{4}$$

$$= -I_{SET} + I_{RST}$$

$$\approx -I_{SET}$$

where I(PM25) is the current in pMOS device PM25 and I(NM15) is the current in nMOS device NM15.

When the first (set) current pulse $I_{SET}$ is inactive (zero) and the second (reset) current pulse $I_{RST}$ is active, pMOS device PM23 pulls node 118 high, pMOS device PM10 is OFF, nMOS device NM21 pulls node 130 low, and nMOS device NM12 is OFF. The current at the reset input 126 of the latch 106 is given by:

$$I(PM25) + I(NM15) \tag{5}$$

$$= I_{RST} - I_{SET}$$

$$\approx I_{RST}$$

The current at the set input 122 of the latch 106 is given by:

$$I(PM15) + I(NM25) \tag{6}$$

$$= -I_{RST} + I_{SET}$$

$$\approx -I_{RST}.$$

A method of operating the level shifter 100 may include: applying a logic input signal IN to the low voltage domain 102 such that the low voltage domain 102 outputs non-overlapping first and second current pulses $I_{SET}$, $I_{RST}$ based on opposite edges of the logic input signal IN; mirroring the first current pulse $I_{SET}$ via the first mirroring path 108 in the high voltage domain 104 and the second current pulse $I_{RST}$ via the second mirroring path 110 in the high voltage domain 104 such that the latch 106 in the high voltage domain 106 is set when the first current pulse $I_{SET}$ is active and reset when the second current pulse $I_{RST}$ is active; and reducing or cancelling the common mode slew current $I_{SLEW}$ that is added to the non-overlapping first and second current pulses $I_{SET}$, $I_{RST}$ before the non-overlapping first and second current pulses $I_{SET}$, $I_{RST}$ are input to the latch 106. The method may further include controlling the non-overlapping first and second current $I_{SET}$, $I_{RST}$ pulses by the same resistor $R_{LIMIT}$ in the low voltage domain 102.

Although the present disclosure is not so limited, the following numbered examples demonstrate one or more aspects of the disclosure.

Example 1

A level shifter, comprising: a low voltage domain configured to output non-overlapping first and second current pulses based on opposite edges of a logic input signal; and a high voltage domain comprising a latch and a current mirror circuit configured to mirror the non-overlapping first and second current pulses such that the latch is set when the first current pulse is active and reset when the second current pulse is active, wherein the current mirror circuit comprises a first mirroring path for the first current pulse and a second mirroring path for the second current pulse, wherein the level shifter has a common mode slew current that is added to the non-overlapping first and second current pulses, wherein the first mirroring path and the second mirroring path are cross-coupled such that the common mode slew current is reduced or cancelled before the non-overlapping first and second current pulses are input to the latch.

Example 2

The level shifter of example 1, wherein the non-overlapping first and second current pulses are controlled by a same resistor in the low voltage domain.

Example 3

The level shifter of example 2, wherein the low voltage domain comprises: a pulse generator configured to generate a first pulse based on a rising or falling edge of the logic input signal and a second pulse based on the other one of the rising or falling edge of the logic input signal; a first inverter coupled between a voltage rail and a reference rail of the low voltage domain and having an input controlled by the first pulse; a second inverter coupled between the voltage rail and the reference rail of the low voltage domain and having an input controlled by the second pulse; a first nMOS transistor device having a gate coupled to an output of the first inverter, a drain that delivers the first current pulse to the first mirroring path of the current mirror circuit, and a source; and a second nMOS transistor device having a gate coupled to an output of the second inverter, a drain that delivers the second current pulse to the second mirroring path of the current mirror circuit, and a source, wherein the resistor couples the source of the first nMOS transistor device and the source of the second nMOS transistor device to the reference rail of the low voltage domain.

Example 4

The level shifter of any of examples 1 through 3, wherein the first mirroring path and the second mirroring path of the current mirror circuit are symmetric.

Example 5

The level shifter of any of examples 1 through 4, wherein both the first mirroring path and the second mirroring path of the current mirror circuit comprise nMOS and pMOS transistor devices, and wherein the nMOS and pMOS transistor devices of the first mirroring path and the nMOS and pMOS transistor devices of the second mirroring path have matching transconductance.

Example 6

The level shifter of any of examples 1 through 5, wherein: the first mirroring path of the current mirror circuit comprises a plurality of first pMOS transistor devices each having a source coupled to a first voltage rail of the high voltage domain, a gate driven by the first current pulse and the common mode slew current, and a drain; the second mirroring path of the current mirror circuit comprises a plurality of second pMOS transistor devices each having a source coupled to the first voltage rail of the high voltage domain, a gate driven by the second current pulse and the common mode slew current, and a drain; the drain of a first one of the first pMOS transistor devices is coupled to a node of the first mirroring path into which the first current pulse and the common mode slew current flows; the drain of a first one of the second pMOS transistor devices is coupled to a node of the second mirroring path into which the second current pulse and the common mode slew current flows; the drain of a second one of the first pMOS transistor devices is coupled to the node of the second mirroring path into which the second current pulse and the common mode slew current flows; and the drain of a second one of the second pMOS transistor devices is coupled to the node of the first mirroring path into which the first current pulse and the common mode slew current flows.

Example 7

The level shifter of example 6, wherein: the first one of the first pMOS transistor devices is sized to support the first current pulse plus the common mode slew current; and the first one of the second pMOS transistor devices is sized to support the second current pulse plus the common mode slew current.

Example 8

The level shifter of example 6 or 7, wherein: the first mirroring path of the current mirror circuit comprises a plurality of first nMOS transistor devices configured to reduce or cancel the common mode slew current from the first current pulse; and the second mirroring path of the current mirror circuit comprises a plurality of second nMOS transistor devices configured to reduce or cancel the common mode slew current from the second current pulse.

Example 9

The level shifter of any of examples 6 through 8, wherein: the first mirroring path of the current mirror circuit comprises a plurality of first nMOS transistor devices each having a source coupled to a second voltage rail of the high voltage domain, a gate driven by the drain of a third one of the first pMOS transistor devices, and a drain; the second mirroring path of the current mirror circuit comprises a plurality of second nMOS transistor devices each having a source coupled to the second voltage rail of the high voltage domain, a gate driven by the drain of a third one of the second pMOS transistor devices, and a drain; the drain of a first one of the first nMOS transistor devices is coupled to the drain of the third one of the first pMOS transistor devices; the drain of a second one of the first nMOS transistor devices is coupled to the drain of a fourth one of the second pMOS transistor devices; the drain of a first one of the second nMOS transistor devices is coupled to the drain of the third one of the second pMOS transistor devices; and the drain of a second one of the second nMOS transistor devices is coupled to the drain of a fourth one of the first pMOS transistor devices.

Example 10

The level shifter of example 9, wherein: the low voltage domain comprises a first nMOS transistor device configured to deliver the first current pulse to the first mirroring path of the current mirror circuit and a second nMOS transistor device configured to deliver the second current pulse to the second mirroring path of the current mirror circuit; both the first nMOS transistor device and the second nMOS transistor device of the low voltage domain have a size of N; each of the first one of the first pMOS transistor devices, the second one of the first pMOS transistor devices, the first one of the second pMOS transistor devices and the second one of the second pMOS transistor devices has a size of N/2; and each of the third one of the first pMOS transistor devices, the fourth one of the first pMOS transistor devices, the third one of the second pMOS transistor devices and the fourth one of the second pMOS transistor devices has a size of N/4.

Example 11

The level shifter of example 9 or 10, wherein: the first mirroring path of the current mirror circuit comprises a plurality of third pMOS transistor devices each having a source coupled to the first voltage rail of the high voltage domain, a gate, and a drain; the second mirroring path of the current mirror circuit comprises a plurality of fourth pMOS transistor devices each having a source coupled to the first voltage rail of the high voltage domain, a gate, and a drain; the drain and the gate of a first one of the third pMOS transistor devices are coupled together; the drain of a second one of the third pMOS transistor devices is coupled to a first input node and a first output node of the latch; the drain and the gate of a first one of the fourth pMOS transistor devices are coupled together; the drain of a second one of the fourth pMOS transistor devices is coupled to a second input node and a second output node of the latch.

Example 12

The level shifter of example 11, wherein: the first mirroring path of the current mirror circuit comprises a plurality of third nMOS transistor devices each having a source coupled to the second voltage rail of the high voltage domain, a gate driven by the fourth one of the first pMOS transistor devices, and a drain; the second mirroring path of the current mirror circuit comprises a plurality of fourth nMOS transistor devices each having a source coupled to the second voltage rail of the high voltage domain, a gate driven by the drain of the fourth one of the second pMOS transistor devices, and a drain; the drain of a first one of the third nMOS transistor devices is coupled to the drain of the fourth one of the first pMOS transistor devices; the drain of a second one of the third nMOS transistor devices is coupled to the drain of the first one of the third pMOS transistor devices; the drain of a third one of the third nMOS transistor devices is coupled to the second output node and the second input node of the latch; the drain of a first one of the fourth nMOS transistor devices is coupled to the drain of the fourth one of the second pMOS transistor devices; the drain of a second one of the fourth nMOS transistor devices is coupled to the drain of the first one of the fourth pMOS transistor devices; and the drain of a third one of the fourth nMOS transistor devices is coupled to the first output node and the first input node of the latch.

Example 13

The level shifter of any of examples 1 through 12, wherein the non-overlapping first and second current pulses both have a pulse width greater than 15 ns.

Example 14

A buck regulator comprising the level shifter of example 1, wherein the level shifter is configured to provide bootstrap control for the buck regulator.

Example 15

A method of operating a level shifter that has a low voltage domain and a high voltage domain, the method comprising: applying a logic input signal to the low voltage domain such that the low voltage domain outputs non-overlapping first and second current pulses based on opposite edges of the logic input signal; mirroring the first current pulse via a first mirroring path in the high voltage domain and the second current pulse via a second mirroring path in the high voltage domain such that a latch in the high voltage domain is set when the first current pulse is active and reset when the second current pulse is active, wherein the first mirroring path and the second mirroring path are cross-coupled; and reducing or cancelling a common mode slew current added to the non-overlapping first and second current pulses before the non-overlapping first and second current pulses are input to the latch.

Example 16

The method of example 15, further comprising: controlling the non-overlapping first and second current pulses by a same resistor in the low voltage domain.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A level shifter, comprising:
    a low voltage domain configured to output non-overlapping first and second current pulses based on opposite edges of a logic input signal; and
    a high voltage domain comprising a latch and a current mirror circuit configured to mirror the non-overlapping first and second current pulses such that the latch is set when the first current pulse is active and reset when the second current pulse is active, wherein the current mirror circuit comprises a first mirroring path for the first current pulse and a second mirroring path for the second current pulse, wherein the level shifter has a common mode slew current that is added to the non-overlapping first and second current pulses, wherein the first mirroring path and the second mirroring path are cross-coupled such that the common mode slew current is reduced or cancelled before the non-overlapping first and second current pulses are input to the latch, wherein the non-overlapping first and second current pulses are controlled by a same resistor in the low voltage domain, wherein the low voltage domain comprises:

a pulse generator configured to generate a first pulse based on a rising or falling edge of the logic input signal and a second pulse based on the other one of the rising or falling edge of the logic input signal;

a first inverter coupled between a voltage rail and a reference rail of the low voltage domain and having an input controlled by the first pulse;

a second inverter coupled between the voltage rail and the reference rail of the low voltage domain and having an input controlled by the second pulse;

a first nMOS transistor device having a gate coupled to an output of the first inverter, a drain that delivers the first current pulse to the first mirroring path of the current mirror circuit, and a source; and a second nMOS transistor device having a gate coupled to an output of the second inverter, a drain that delivers the second current pulse to the second mirroring path of the current mirror circuit, and a source, wherein the resistor couples the source of the first nMOS transistor device and the source of the second nMOS transistor device to the reference rail of the low voltage domain.

2. The level shifter of claim 1, wherein the first mirroring path and the second mirroring path of the current mirror circuit are symmetric.

3. The level shifter of claim 1, wherein both the first mirroring path and the second mirroring path of the current mirror circuit comprise nMOS and pMOS transistor devices, and wherein the nMOS and pMOS transistor devices of the first mirroring path and the nMOS and pMOS transistor devices of the second mirroring path have matching transconductance.

4. The level shifter of claim 1, wherein:

the first mirroring path of the current mirror circuit comprises a plurality of first pMOS transistor devices each having a source coupled to a first voltage rail of the high voltage domain, a gate driven by the first current pulse and the common mode slew current, and a drain;

the second mirroring path of the current mirror circuit comprises a plurality of second pMOS transistor devices each having a source coupled to the first voltage rail of the high voltage domain, a gate driven by the second current pulse and the common mode slew current, and a drain;

the drain of a first one of the first pMOS transistor devices is coupled to a node of the first mirroring path into which the first current pulse and the common mode slew current flows;

the drain of a first one of the second pMOS transistor devices is coupled to a node of the second mirroring path into which the second current pulse and the common mode slew current flows;

the drain of a second one of the first pMOS transistor devices is coupled to the node of the second mirroring path into which the second current pulse and the common mode slew current flows; and the drain of a second one of the second pMOS transistor devices is coupled to the node of the first mirroring path into which the first current pulse and the common mode slew current flows.

5. The level shifter of claim 4, wherein:

the first one of the first pMOS transistor devices is sized to support the first current pulse plus the common mode slew current; and the first one of the second pMOS transistor devices is sized to support the second current pulse plus the common mode slew current.

6. The level shifter of claim 4, wherein:

the first mirroring path of the current mirror circuit comprises a plurality of first nMOS transistor devices configured to reduce or cancel the common mode slew current from the first current pulse; and the second mirroring path of the current mirror circuit comprises a plurality of second nMOS transistor devices configured to reduce or cancel the common mode slew current from the second current pulse.

7. The level shifter of claim 4, wherein:

the first mirroring path of the current mirror circuit comprises a plurality of first nMOS transistor devices each having a source coupled to a second voltage rail of the high voltage domain, a gate driven by the drain of a third one of the first pMOS transistor devices, and a drain;

the second mirroring path of the current mirror circuit comprises a plurality of second nMOS transistor devices each having a source coupled to the second voltage rail of the high voltage domain, a gate driven by the drain of a third one of the second pMOS transistor devices, and a drain;

the drain of a first one of the first nMOS transistor devices is coupled to the drain of the third one of the first pMOS transistor devices;

the drain of a second one of the first nMOS transistor devices is coupled to the drain of a fourth one of the second pMOS transistor devices;

the drain of a first one of the second nMOS transistor devices is coupled to the drain of the third one of the second pMOS transistor devices; and the drain of a second one of the second nMOS transistor devices is coupled to the drain of a fourth one of the first pMOS transistor devices.

8. The level shifter of claim 7, wherein:

both the first nMOS transistor device and the second nMOS transistor device of the low voltage domain have a size of N;

each of the first one of the first pMOS transistor devices, the second one of the first pMOS transistor devices, the first one of the second pMOS transistor devices and the second one of the second pMOS transistor devices has a size of N/2; and each of the third one of the first pMOS transistor devices, the fourth one of the first pMOS transistor devices, the third one of the second pMOS transistor devices and the fourth one of the second pMOS transistor devices has a size of N/4.

9. The level shifter of claim 7, wherein:

the first mirroring path of the current mirror circuit comprises a plurality of third pMOS transistor devices each having a source coupled to the first voltage rail of the high voltage domain, a gate, and a drain;

the second mirroring path of the current mirror circuit comprises a plurality of fourth pMOS transistor devices each having a source coupled to the first voltage rail of the high voltage domain, a gate, and a drain;

the drain and the gate of a first one of the third pMOS transistor devices are coupled together;

the drain of a second one of the third pMOS transistor devices is coupled to a first input node and a first output node of the latch;

the drain and the gate of a first one of the fourth pMOS transistor devices are coupled together;

the drain of a second one of the fourth pMOS transistor devices is coupled to a second input node and a second output node of the latch.

10. The level shifter of claim 9, wherein:

the first mirroring path of the current mirror circuit comprises a plurality of third nMOS transistor devices each having a source coupled to the second voltage rail of the high voltage domain, a gate driven by the fourth one of the first pMOS transistor devices, and a drain;

the second mirroring path of the current mirror circuit comprises a plurality of fourth nMOS transistor devices each having a source coupled to the second voltage rail of the high voltage domain, a gate driven by the drain of the fourth one of the second pMOS transistor devices, and a drain;

the drain of a first one of the third nMOS transistor devices is coupled to the drain of the fourth one of the first pMOS transistor devices;

the drain of a second one of the third nMOS transistor devices is coupled to the drain of the first one of the third pMOS transistor devices;

the drain of a third one of the third nMOS transistor devices is coupled to the second output node and the second input node of the latch;

the drain of a first one of the fourth nMOS transistor devices is coupled to the drain of the fourth one of the second pMOS transistor devices;

the drain of a second one of the fourth nMOS transistor devices is coupled to the drain of the first one of the fourth pMOS transistor devices; and the drain of a third one of the fourth nMOS transistor devices is coupled to the first output node and the first input node of the latch.

11. The level shifter of claim 1, wherein the non-overlapping first and second current pulses both have a pulse width greater than 15 ns.

12. A buck regulator comprising the level shifter of claim 1, wherein the level shifter is configured to provide bootstrap control for the buck regulator.

13. A level shifter, comprising:

a low voltage domain configured to output non-overlapping first and second current pulses based on opposite edges of a logic input signal; and a high voltage domain comprising a latch and a current mirror circuit configured to mirror the non-overlapping first and second current pulses such that the latch is set when the first current pulse is active and reset when the second current pulse is active, wherein the current mirror circuit comprises a first mirroring path for the first current pulse and a second mirroring path for the second current pulse, wherein the level shifter has a common mode slew current that is added to the non-overlapping first and second current pulses, wherein the first mirroring path and the second mirroring path are cross-coupled such that the common mode slew current is reduced or cancelled before the non-overlapping first and second current pulses are input to the latch, wherein the first mirroring path of the current mirror circuit comprises a plurality of first pMOS transistor devices each having a source coupled to a first voltage rail of the high voltage domain, a gate driven by the first current pulse and the common mode slew current, and a drain, wherein the second mirroring path of the current mirror circuit comprises a plurality of second pMOS transistor devices each having a source coupled to the first voltage rail of the high voltage domain, a gate driven by the second current pulse and the common mode slew current, and a drain, wherein the drain of a first one of the first pMOS transistor devices is coupled to a node of the first mirroring path into which the first current pulse and the common mode slew current flows, wherein the drain of a first one of the second pMOS transistor devices is coupled to a node of the second mirroring path into which the second current pulse and the common mode slew current flows, wherein the drain of a second one of the first pMOS transistor devices is coupled to the node of the second mirroring path into which the second current pulse and the common mode slew current flows, wherein the drain of a second one of the second pMOS transistor devices is coupled to the node of the first mirroring path into which the first current pulse and the common mode slew current flows, wherein the first one of the first pMOS transistor devices is sized to support the first current pulse plus the common mode slew current, wherein the first one of the second pMOS transistor devices is sized to support the second current pulse plus the common mode slew current.

14. A level shifter, comprising:

a low voltage domain configured to output non-overlapping first and second current pulses based on opposite edges of a logic input signal; and a high voltage domain comprising a latch and a current mirror circuit configured to mirror the non-overlapping first and second current pulses such that the latch is set when the first current pulse is active and reset when the second current pulse is active, wherein the current mirror circuit comprises a first mirroring path for the first current pulse and a second mirroring path for the second current pulse, wherein the level shifter has a common mode slew current that is added to the non-overlapping first and second current pulses, wherein the first mirroring path and the second mirroring path are cross-coupled such that the common mode slew current is reduced or cancelled before the non-overlapping first and second current pulses are input to the latch, wherein the first mirroring path of the current mirror circuit comprises a plurality of first pMOS transistor devices each having a source coupled to a first voltage rail of the high voltage domain, a gate driven by the first current pulse and the common mode slew current, and a drain;

wherein the second mirroring path of the current mirror circuit comprises a plurality of second pMOS transistor devices each having a source coupled to the first voltage rail of the high voltage domain, a gate driven by the second current pulse and the common mode slew current, and a drain;

wherein the drain of a first one of the first pMOS transistor devices is coupled to a node of the first mirroring path into which the first current pulse and the common mode slew current flows;

wherein the drain of a first one of the second pMOS transistor devices is coupled to a node of the second mirroring path into which the second current pulse and the common mode slew current flows;

wherein the drain of a second one of the first pMOS transistor devices is coupled to the node of the second mirroring path into which the second current pulse and the common mode slew current flows; and wherein the drain of a second one of the second pMOS transistor devices is coupled to the node of the first mirroring path into which the first current pulse and the common mode slew current flows, wherein the first mirroring path of the current mirror circuit comprises a plurality of first nMOS transistor devices each having a source coupled to a second voltage rail of the high voltage domain, a gate driven by the drain of a third one of the first pMOS transistor devices, and a drain, wherein the second mirroring path of the current mirror circuit comprises a plurality of second nMOS transistor devices each having a source coupled to the second voltage rail of the high voltage domain, a gate driven by the drain of a third one of the second pMOS transistor devices, and a drain, wherein the drain of a first one of the first nMOS transistor devices is coupled to the drain of the third one of the first pMOS transistor devices, wherein the drain of a second one of the first nMOS transistor devices is coupled to the drain of a fourth one of the second pMOS transistor devices, wherein the drain of a first one of the second nMOS transistor devices is coupled to the drain of the third one of the second pMOS transistor devices, wherein the drain of a second one of the second nMOS transistor devices is coupled to the drain of a fourth one of the first pMOS transistor devices, wherein the low voltage domain comprises a first nMOS transistor device configured to deliver the first current pulse to the first mirroring path of the current mirror circuit and a second nMOS transistor device configured to deliver the second current pulse to the second mirroring path of the current mirror circuit, wherein both the first nMOS transistor device and the second nMOS transistor device of the low voltage domain have a size of N, wherein each of the first one of the first pMOS transistor devices, the second one of the first pMOS transistor devices, the first one of the second pMOS transistor devices and the second one of the second pMOS transistor devices has a size of N/2, wherein each of the third one of the first pMOS transistor devices, the fourth one of the first pMOS transistor devices, the third one of the second pMOS transistor devices and the fourth one of the second pMOS transistor devices has a size of N/4.

* * * * *